United States Patent
Yang et al.

(10) Patent No.: US 8,839,009 B2
(45) Date of Patent: Sep. 16, 2014

(54) SYSTEMS AND METHODS FOR DECIMATION BASED OVER-CURRENT CONTROL

(75) Inventors: Shaohua Yang, Santa Clara, CA (US); Yang Han, Sunnyvale, CA (US); Zongwang Li, San Jose, CA (US); Fan Zhang, Milpitas, CA (US); Haitao Xia, San Jose, CA (US)

(73) Assignee: LSI Corporation, San Jose, CA (US)

( * ) Notice: Subject to any disclaimer, the term of this patent is extended or adjusted under 35 U.S.C. 154(b) by 523 days.

(21) Appl. No.: 13/339,403

(22) Filed: Dec. 29, 2011

(65) Prior Publication Data
US 2013/0173932 A1    Jul. 4, 2013

(51) Int. Cl.
| | |
|---|---|
| *G06F 1/32* | (2006.01) |
| *G06F 1/26* | (2006.01) |
| *H03M 1/00* | (2006.01) |
| *H03M 1/12* | (2006.01) |
| *G06F 3/06* | (2006.01) |

(52) U.S. Cl.
CPC ............ *G06F 1/3287* (2013.01); *G06F 1/3268* (2013.01); *G06F 1/3221* (2013.01); *G06F 1/26* (2013.01); *G06F 3/0625* (2013.01); *G06F 1/3203* (2013.01); *H03M 1/12* (2013.01); *H03M 1/002* (2013.01)
USPC ............ 713/300; 713/324; 341/126; 341/155

(58) Field of Classification Search
None
See application file for complete search history.

(56) References Cited

U.S. PATENT DOCUMENTS

| | | | |
|---|---|---|---|
| 5,544,138 A | 8/1996 | Bajorek et al. | |
| 5,715,467 A | 2/1998 | Jirgal | |
| 6,973,583 B2 | 12/2005 | Kobori | |
| 6,983,389 B1 | 1/2006 | Filippo | |
| 7,049,771 B2 | 5/2006 | Katanaya | |
| 7,055,117 B2 | 5/2006 | Yee | |
| 7,203,857 B2 | 4/2007 | Hamilton | |
| 7,412,615 B2 | 8/2008 | Yokota et al. | |
| 7,529,958 B2 | 5/2009 | Roth et al. | |
| 7,739,533 B2 | 6/2010 | Rauschmayer | |
| 8,239,700 B2 | 8/2012 | Nation | |
| 8,245,061 B2 | 8/2012 | Rauschmayer | |
| 8,291,251 B2 | 10/2012 | Rauschmayer | |
| 2009/0235116 A1* | 9/2009 | Tan et al. | 714/15 |
| 2010/0176976 A1* | 7/2010 | Breems et al. | 341/120 |
| 2010/0264983 A1 | 10/2010 | Nation | |
| 2010/0268917 A1 | 10/2010 | Nation et al. | |
| 2010/0269074 A1 | 10/2010 | Nation | |
| 2013/0051211 A1* | 2/2013 | Bailey et al. | 369/174 |
| 2014/0016688 A1* | 1/2014 | Venkataramani et al. | 375/232 |

FOREIGN PATENT DOCUMENTS

JP    2004118240    4/2004

OTHER PUBLICATIONS

IBM, "Adaptive Power Management for Mobile Hard Drives", Apr. 1999, see www.almaden.ibm.com/almaden/mobile_hard_drives.html.

U.S. Appl. No. 13/284,684, filed Oct. 28, 2011, Shaohua Yang, Unpublished.

(Continued)

*Primary Examiner* — Ji H Bae
(74) *Attorney, Agent, or Firm* — Hamilton DeSanctis & Cha (57) ABSTRACT

The present inventions are related to systems and methods for data processing, and more particularly to systems and methods for power governance in a data processing system. In some such systems and methods, the operation of one or more calibration circuits is modified when it is determined that too many data processing circuits are active.

20 Claims, 5 Drawing Sheets

(56) References Cited

OTHER PUBLICATIONS

U.S. Appl. No. 13/167,760, filed Jun. 24, 2011, Changyou Xu, Unpublished.

U.S. Appl. No. 13/227,557, filed Sep. 8, 2011, Shaohua Yang, Unpublished.

U.S. Appl. No. 13/167,764, filed Jun. 24, 2011, Zongwang Li, Unpublished.

* cited by examiner

SYSTEMS AND METHODS FOR DECIMATION BASED OVER-CURRENT CONTROL

BACKGROUND OF THE INVENTION

The present inventions are related to systems and methods for data processing, and more particularly to systems and methods for power governance in a data processing system.

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. In some cases, the data processing function uses a variable number of iterations depending upon the characteristics of the data being processed. The variable number of processing iterations result in ambiguity in determining circuit power requirements, and can require the choice of an expensive packaging designed to dissipate power at a higher rate than may actually be required.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for power governance in a data processing system.

Various embodiments of the present invention provide data processing systems. The data processing systems include: a noise predictive calibration circuit, a first data detector circuit, a second data detector circuit, a data decoder circuit, and a power governing circuit. The noise predictive calibration circuit is operable to provide a noise predictive parameter. Operation of both the first data detector circuit and the second data detector circuit is governed at least in part by the noise predictive parameter. The power governing circuit is operable to determine that a defined set of the first data detector circuit, the second data detector circuit, and the data decoder circuit are operating simultaneously, and to modify operation of the noise predictive calibration circuit. In some instances of the aforementioned embodiments, the system is implemented as an integrated circuit. In various instances of the aforementioned embodiments, the data processing system is incorporated in a storage device, or a data transmission device. In some cases, modifying operation of the noise predictive calibration circuit includes performing an operational modification that may be, but is not limited to, disabling the noise predictive calibration circuit, or reducing an update rate of the noise predictive parameter by the noise predictive calibration circuit.

In various instances of the aforementioned embodiments, the data processing system further includes an equalizer calibration circuit and an equalizer circuit. The equalizer calibration circuit is operable to provide an equalizer parameter, and the equalizer circuit operable to equalize a data input to yield an equalized output governed at least in part by the equalizer parameter. In such instances, the first data detector circuit is operable to apply a data detection algorithm to the equalized output to yield a first detected output, and the power governing circuit is further operable to modify operation of the equalizer calibration circuit. In some cases, modifying operation of the equalizer calibration circuit includes performing an operational modification that may be, but is not limited to, disabling the equalizer calibration circuit, or reducing an update rate of the equalizer parameter by the equalizer calibration circuit.

Other embodiments of the present invention provide data processing systems that include: an equalizer calibration circuit, an equalizer circuit, a data detector circuit, a data decoder circuit, and a power governing circuit. The equalizer calibration circuit is operable to provide an equalizer parameter, and the equalizer circuit operable to equalize a data input to yield an equalized output governed at least in part by the equalizer parameter. The data detector circuit is operable to apply a data detection algorithm to the equalized output to yield a detected output. The data decoder circuit is operable to apply a data decode algorithm to the detected output to yield a decoded output. The power governing circuit is operable to determine that a defined set of the data detector circuit and the data decoder circuit are operating simultaneously, and to modify operation of the equalizer calibration circuit. In some instances of the aforementioned embodiments, the system is implemented as an integrated circuit. In various instances of the aforementioned embodiments, the data processing system is incorporated in a storage device, or a data transmission device. In some cases, modifying operation of the equalizer calibration circuit includes performing an operational modification that may be, but is not limited to, disabling the equalizer calibration circuit, or reducing an update rate of the equalizer parameter by the equalizer calibration circuit.

Yet other embodiments of the present invention provide methods for data processing. The methods include: updating an equalizer parameter; equalizing a data input to yield an equalized output based at least in part on the equalizer parameter; updating a noise predictive parameter; applying a data detection algorithm by a first data detector circuit to the equalized output to yield a first detected output based at least in part on the noise predictive parameter; applying a data decode algorithm by a data decode circuit to the first detected output to yield a decoded output; applying the data detection algorithm by a second data detector circuit to the equalized output guided by the decoded output to yield a second detected output based at least in part on the noise predictive parameter; determining that a defined set of the first data detector circuit, the second data detector circuit, and the data decoder circuit are operating simultaneously; modifying updating of the equalizer parameter based at least in part on the determination that the defined set of the first data detector circuit, the second data detector circuit, and the data decoder circuit are operating simultaneously; and modifying updating of the noise predictive parameter based at least in part on the determination that the defined set of the first data detector circuit, the second data detector circuit, and the data decoder circuit are operating simultaneously.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for power governance in a data processing system.

Various embodiments of the present invention provide for power governance in a variable data processing system. As an example, a variable data processing system may include two or more data detector circuits in parallel and a data decoder circuit through which data is passed in an attempt to recover the original data. Depending upon how many of the aforementioned detector and decoder circuits that are operating in parallel, one or more slow changing circuits may be disabled and/or slowed down to avoid an over current condition. The slow changing circuits may be, but are not limited to, adaptive calibration circuits. In one case, the adaptive calibration circuit adaptively calibrates one or more coefficients governing operation of an equalizer circuit and one or more coefficients governing operations of a noise predictive filter circuit. Based upon the disclosure provided herein, one of ordinary skill in the art will recognize a variety of slow changing circuits that may be disabled to avoid an over current condition.

Figure 1:
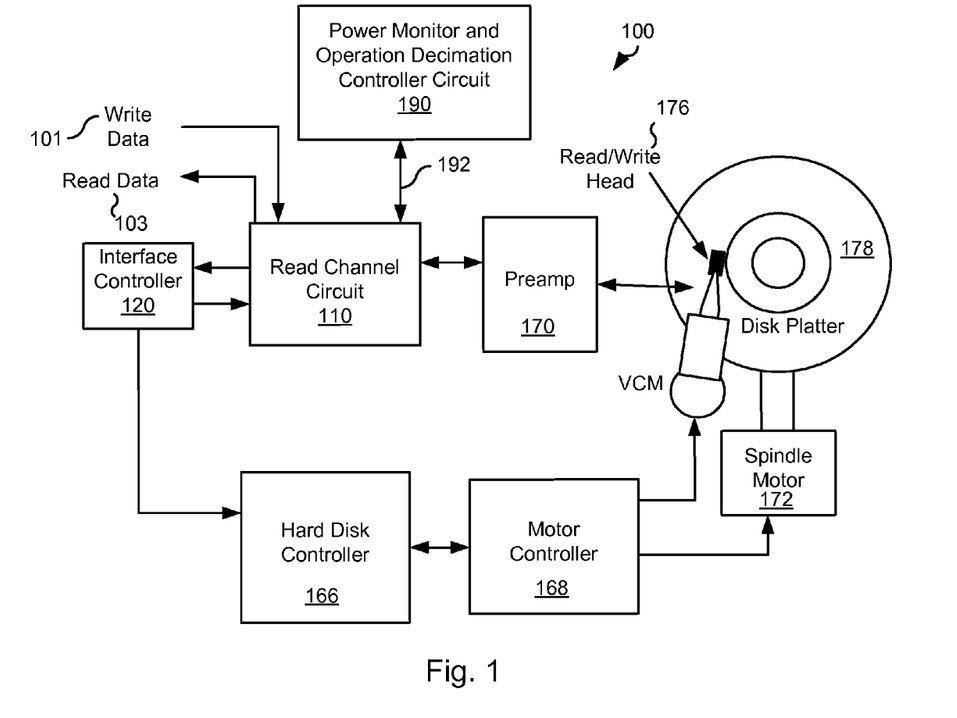
FIG. 1 shows a storage system including a power monitor and operation decimation controller circuit in accordance with various embodiments of the present invention.

Turning to FIG. 1, a storage system 100 including a read channel circuit 110 including a power monitor and operation decimation controller circuit 190 is shown in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 utilizes a variable data processing circuit that allows different chunks of data to utilize different amounts of processing bandwidth depending, for example, upon the signal to noise ratio exhibited by a received data set. The processing bandwidth is distributed between two or more data detector circuits, at least one data decoder circuit, and the associated memories. A status signal 192 (idle/busy, enable) is provided between power monitor and operation decimation controller circuit 190 and read channel circuit 110. Power monitor and operation decimation controller circuit 190 determines whether too many of the data detector circuits and decoder circuit are simultaneously processing. Where it is determined that too much simultaneous processing is ongoing, power monitor and operation decimation controller circuit 190 disables or modifies operations of one or more slow changing circuits to avoid an over current condition. The slow changing circuits may be, but are not limited to, adaptive calibration circuits. In one case, the adaptive calibration circuit adaptively calibrates one or more coefficients governing operation of an equalizer circuit and one or more coefficients governing operations of a noise predictive filter circuit. Based upon the disclosure provided herein, one of ordinary skill in the art will recognize a variety of slow changing circuits that may be disabled to avoid an over current condition. Read channel circuit 110 may be implemented to include a data processing circuit similar to that discussed below in relation to FIG. 3. Further, the adjustment to the operation of one or more of the slow changing circuits may be done consistent with one or more of the approaches discussed below in relation to FIGS. 4-6.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Figure 2:
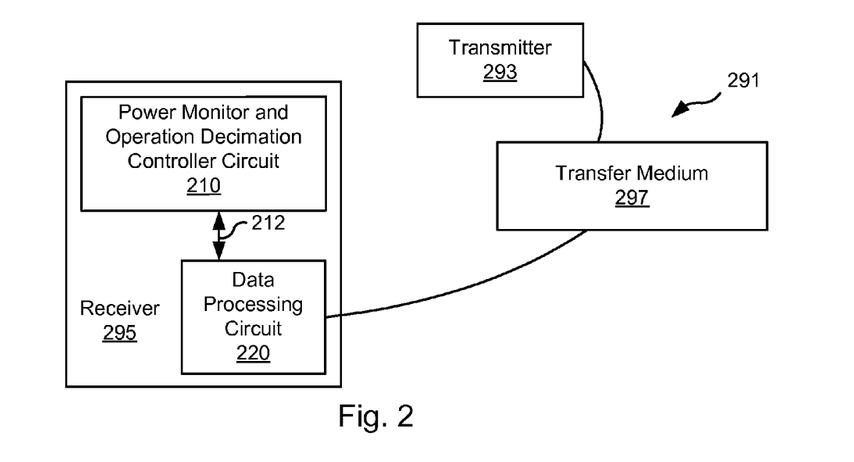
FIG. 2 depicts a data transmission system including a power monitor and operation decimation controller circuit in accordance with one or more embodiments of the present invention.

Turning to FIG. 2, a data transmission system 200 including a power monitor and operation decimation controller circuit 210 is shown in accordance with one or more embodiments of the present invention. Data transmission system 200 includes a transmitter 293 that is operable to transmit encoded information via a transfer medium 297 as is known in the art. The encoded data is received from transfer medium 297 by a receiver 295. Receiver 295 includes a data processing circuit 220, and a detector processing overlap monitor and control circuit 210. Data processing circuit 220 is a variable data processing circuit that allows different chunks of data to utilize different amounts of processing bandwidth depending, for example, upon the signal to noise ratio exhibited by a received data set. The processing bandwidth is distributed between at least two data detector circuits, at least one data decoder circuit, and the associated memories. Status signals 212 (e.g., idle/busy, enable) are provided between a power monitor and operation decimation controller circuit 210 and data processing circuit 220. Receiver 295 determines whether too many of the data detector circuits and decoder circuit included in data processing circuit 220 are simultaneously processing. Where it is determined that too much simultaneous processing is ongoing, power monitor and operation decimation controller circuit 210 disables or modifies operations of one or more slow changing circuits to avoid an over current condition. The slow changing circuits may be, but are not limited to, adaptive calibration circuits. In one case, the adaptive calibration circuit adaptively calibrates one or more coefficients governing operation of an equalizer circuit and one or more coefficients governing operations of a noise predictive filter circuit. Based upon the disclosure provided herein, one of ordinary skill in the art will recognize a variety of slow changing circuits that may be disabled to avoid an over current condition. Receiver 295 may be implemented to include a data processing circuit similar to that discussed below in relation to FIG. 3. Further, the adjustment to the operation of one or more of the slow changing circuits may be done consistent with one or more of the approaches discussed below in relation to FIGS. 4-6.

Figure 3:
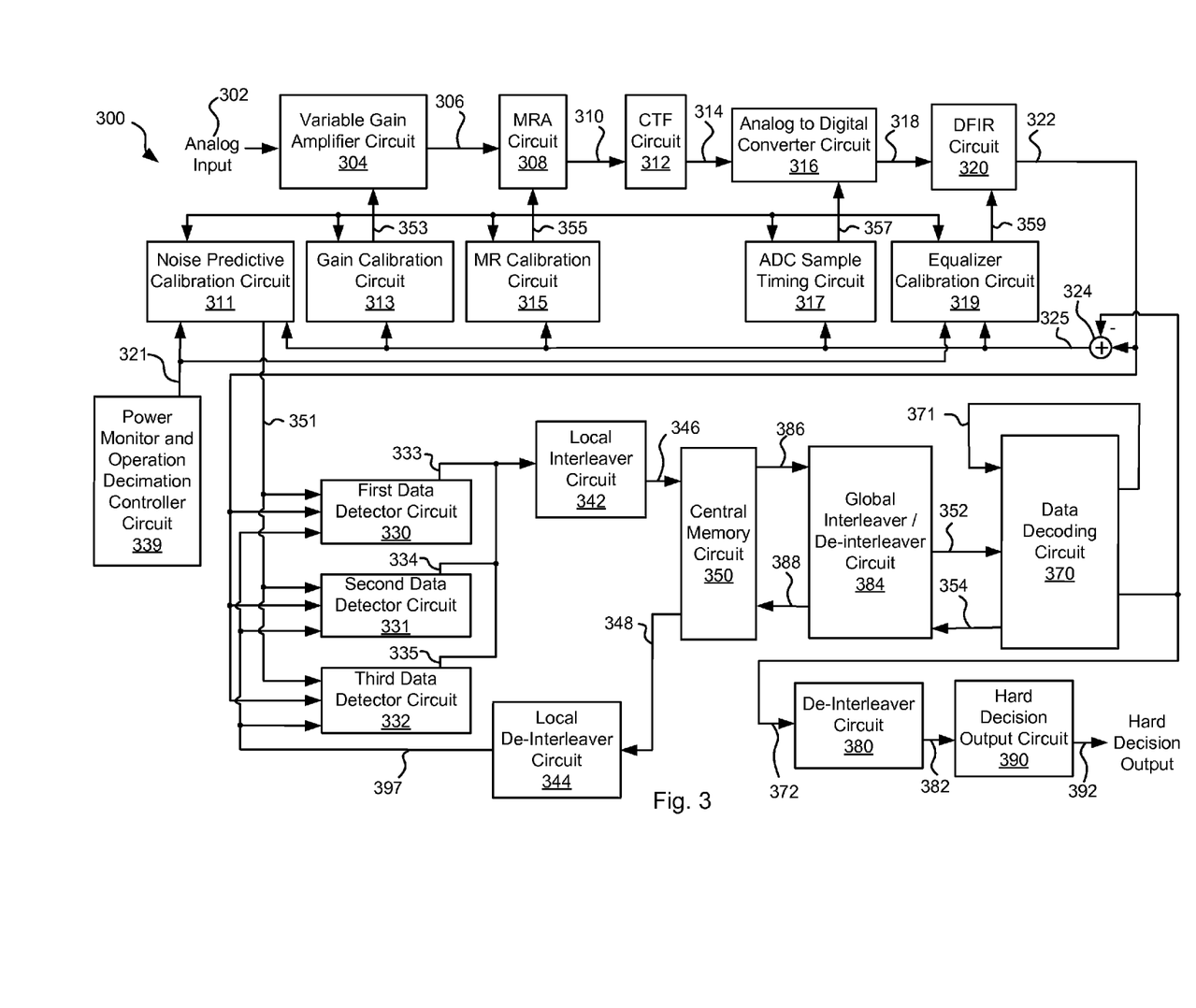
FIG. 3 shows a data processing circuit including a power monitor and operation decimation controller circuit in accordance with some embodiments of the present invention.

FIG. 3 shows a data processing circuit 300 including a power monitor and operation decimation controller circuit 339 in accordance with some embodiments of the present invention. Data processing circuit 300 includes a variable gain amplifier circuit 304 that is operable to amplify an analog input 302 to yield an amplified output 306. The amount of amplification is governed by a gain output 353 from a gain calibration circuit 313. In some cases, analog signal 302 is derived from a read/write head assembly (not shown) that is disposed in relation to a storage medium (not shown). In other cases, analog signal 302 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 302 may be derived.

An MRA circuit 308 compensates for any magneto resistive asymmetry (MRA) in amplified signal 306 to yield a corrected signal 310. MRA circuit 308 may be any circuit known in the art that is capable of detecting and compensating for magneto resistive asymmetry. The MRA correction applied by MRA circuit 308 is governed by an MRA feedback value 355 from an MR calibration circuit 315. Corrected signal 310 is provided to a continuous time filter (CTF) circuit 312 that filters the received input to yield a filtered output 314. CTF circuit 312 may be any circuit known in the art that is capable of filtering an analog input signal. Filtered output 314 is provided to an analog to digital converter circuit 316.

Analog to digital converter circuit 316 converts filtered output 314 into a corresponding series of digital samples 318 at sample times governed by a sample time input 357 from an ADC sample timing circuit 317. Analog to digital converter circuit 316 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 318 are provided to an equalizer circuit 320. Equalizer circuit 320 applies an equalization algorithm to digital samples 318 to yield an equalized output 322. The equalization is governed by coefficients 359 provided from an equalizer calibration circuit 319. In some embodiments of the present invention, equalizer circuit 320 is a digital finite impulse response filter circuit as are known in the art. In some cases, equalizer 320 includes sufficient memory to maintain one or more codewords at least until one of a first data detector circuit 330, a second data detector circuit 331, or a data detector circuit 332 is available for processing.

A summation circuit 324 subtracts a decoded output 372 from corresponding instances of equalized output 322 to yield an error output 325. Error output 325 is provided to each of a noise predictive calibration circuit 311, gain calibration circuit 313, MR calibration circuit 315, ADC sample timing circuit 317, and equalizer calibration circuit 319. Each of noise predictive calibration circuit 311, gain calibration circuit 313, MR calibration circuit 315, ADC sample timing circuit 317, and equalizer calibration circuit 319 adjust respective parameters governing aspects of operation of first data detector circuit 330, second data detector circuit 331, third data detector circuit 332, gain calibration circuit 313, MR calibration circuit 315, ADC sample timing circuit 317 and equalizer calibration circuit 319 to reduce error value 325 to an acceptable level. Noise predictive calibration circuit 311 may be any circuit known in the art for adjusting one or more parameters governing operation of a data detector circuit. Gain calibration circuit 313 may be any circuit known in the art that is capable of adjusting one or more parameters governing operation of a variable gain amplifier circuit. MR calibration circuit 315 may be any circuit known in the art that is capable of adjusting one or more parameters governing operation of an MRA circuit. ADC sample timing circuit 317 may be any circuit known in the art that is capable of adjusting one or more parameters governing operation of an analog to digital conversion circuit. Equalizer calibration circuit 319 may be any circuit known in the art that is capable of adjusting one or more parameters governing operation of an equalizer circuit.

Each of first data detector circuit 330, second data detector circuit 331, and third data detector circuit 332 includes a noise predictive filter circuit that operates in part based upon a noise predictive filter target 351 provided by noise predictive calibration circuit 311. Each of first data detector circuit 330, second data detector circuit 331, and third data detector circuit 332 is operable to apply a data detection algorithm to a received codeword or data set. In some embodiments of the present invention, each of first data detector circuit 330, second data detector circuit 331, and third data detector circuit 332 is a Viterbi algorithm data detector circuit as are known in the art. In other embodiments of the present invention, each of first data detector circuit 330, second data detector circuit 331, and third data detector circuit 332 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, first data detector circuit 330 is used to apply the data detection algorithm to the received codeword for the first global iteration applied to the received codeword, and one of second data detector circuit 331 or third data detector circuit 332 is operable apply the data detection algorithm to the received codeword guided by a decoded output accessed from a central memory circuit 350 on subsequent global iterations. In any event, when each of first data detector circuit 330, second data detector circuit 331, and third data detector circuit 332 are processing a codeword, a respective operational status bit is asserted to power monitor and operation decimation controller circuit 339.

Upon completion of application of the data detection algorithm to the received codeword on the first global iteration through first data detector circuit 330, first data detector circuit 330 provides a detector output 333. Detector output 333 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 333 is provided to a local interleaver circuit 342. Local interleaver circuit 342 is operable to shuffle sub-portions (i.e., local chunks) of the data set included as detected output and provides an interleaved codeword 346 that is stored to central memory circuit 350. Interleaver circuit 342 may be any circuit known in the art that is capable of shuffling data sets to yield a re-arranged data set. Interleaved codeword 346 is stored to central memory circuit 350.

Once a data decoding circuit 370 is available, a previously stored interleaved codeword 346 is accessed from central memory circuit 350 as a stored codeword 386 and globally interleaved by a global interleaver/de-interleaver circuit 384. Global interleaver/De-interleaver circuit 384 may be any circuit known in the art that is capable of globally rearranging codewords. Global interleaver/De-interleaver circuit 384 provides a decoder input 352 into data decoding circuit 370. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. Data decoding circuit 370 applies a data decode algorithm to decoder input 352 to yield a decoded output 371. In cases where another local iteration (i.e., another pass trough data decoder circuit 370) is desired, data decoding circuit 370 re-applies the data decode algorithm to decoder input 352 guided by decoded output 371. This continues until either a maximum number of local iterations is exceeded or decoded output 371 converges. When operational, data decoding circuit 370 asserts an operational status bit that is provided to power monitor and operation decimation controller circuit 339.

Where decoded output 371 fails to converge (i.e., fails to yield the originally written data set) and a number of local iterations through data decoder circuit 370 exceeds a threshold, the resulting decoded output is provided as a decoded output 354 back to central memory circuit 350 where it is stored awaiting another global iteration through one of second data detector circuit 331 or third data detector circuit 332, and data decoding circuit 370. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352.

One of second data detector circuit 331 or third data detector circuit 332 is scheduled based upon availability to re-apply the data detection algorithm to the received codeword guided by a previously stored de-interleaved output 388 accessed from central memory circuit 350 and locally de-interleaved by a de-interleaver circuit 344. De-interleaver circuit 344 re-arranges decoder output 348 to reverse the shuffling originally performed by interleaver circuit 342. A resulting de-interleaved output 397 is provided to the scheduled one of first data detector circuit 331 or second data detector circuit 332 where it is used to guide subsequent detection of a corresponding data set previously received as equalized output 322.

Alternatively, where the decoded output converges (i.e., yields the originally written data set), the resulting decoded output is provided as an output codeword 372 to a de-interleaver circuit 380. De-interleaver circuit 380 rearranges the data to reverse both the global and local interleaving applied to the data to yield a de-interleaved output 382. De-interleaved output 382 is provided to a hard decision output circuit 390. Hard decision output circuit 390 is operable to re-order data sets that may complete out of order back into their original order. The originally ordered data sets are then provided as a hard decision output 392.

Power monitor and operation decimation controller circuit 339 selectively controls an operational status of noise predictive calibration circuit 311 and equalizer calibration circuit 319. In particular embodiments of the present invention, when all of the operational status bits from each of first data detector circuit 330, second data detector circuit 331, third data detector circuit 332, and data decoding circuit 370 indicate that the respective circuits are operating at the same time, power monitor and operation decimation controller circuit 339 asserts a disable signal 321 that causes noise predictive calibration circuit 311 and equalizer calibration circuit 319 to suspend operation thereby reducing the current requirements of data processing circuit 300 similar to that discussed below in relation to FIG. 4. In such embodiments, when all of the respective circuits cease operating at the same time, power monitor and operation decimation controller circuit 339 de-asserts a disable signal 321 that causes noise predictive calibration circuit 311 and equalizer calibration circuit 319 to return to normal operation.

Figure 5:
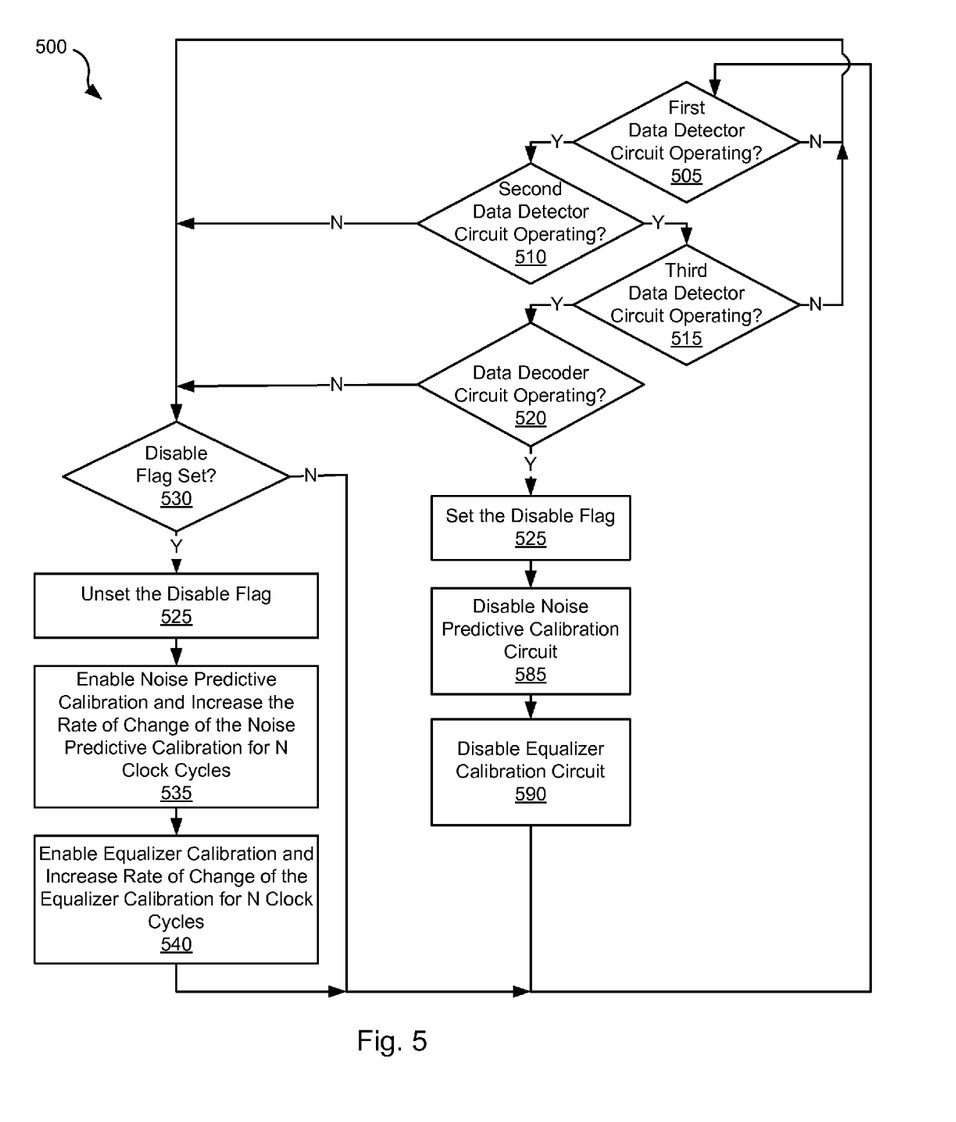
FIG. 5 is a flow diagram showing a method in accordance with other embodiments of the present invention for mitigating over current scenarios in a variable data processing system.

In other embodiments of the present invention, when all of the operational status bits from each of first data detector circuit 330, second data detector circuit 331, third data detector circuit 332, and data decoding circuit 370 indicate that the respective circuits are operating at the same time, power monitor and operation decimation controller circuit 339 asserts a disable signal 321 that causes noise predictive calibration circuit 311 and equalizer calibration circuit 319 to suspend operation thereby reducing the current requirements of data processing circuit 300 similar to that discussed below in relation to FIG. 5. In such embodiments, when all of the respective circuits cease operating at the same time, power monitor and operation decimation controller circuit 339 de-asserts a disable signal 321 which causes noise predictive calibration circuit 311 and equalizer calibration circuit 319 to return to operation for a period of time with an increased gain factor that causes noise predictive filter target 351 and coefficients 359 to change more rapidly, and after the period of time noise predictive calibration circuit 311 and equalizer calibration circuit 319 to return to normal operation. Based upon the disclosure provided herein, one of ordinary skill in the art will recognize different periods of time over which the more rapid change of noise predictive filter target 351 and coefficients 359 after resuming operation is to be done.

Figure 6:
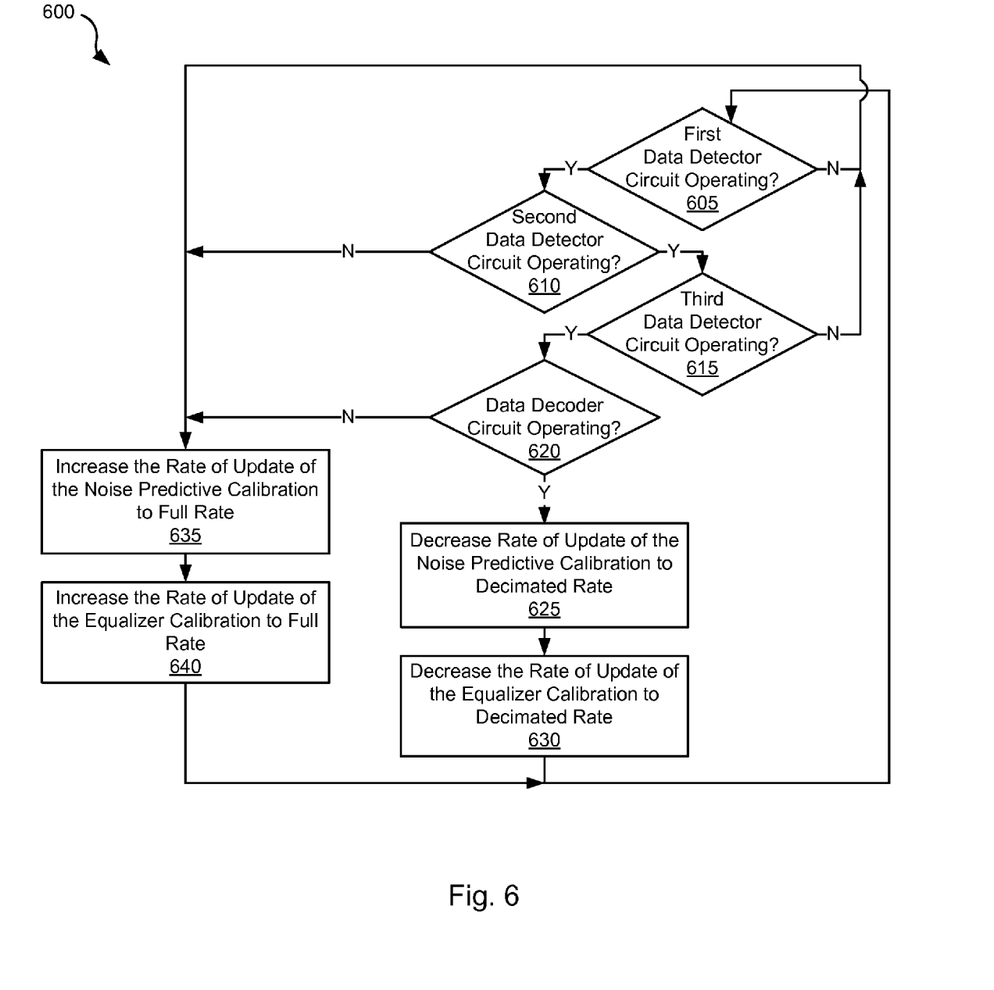
FIG. 6 is a flow diagram showing a method in accordance with yet other embodiments of the present invention for mitigating over current scenarios in a variable data processing system.

In yet other embodiments of the present invention, when all of the operational status bits from each of first data detector circuit 330, second data detector circuit 331, third data detector circuit 332, and data decoding circuit 370 indicate that the respective circuits are operating at the same time, power monitor and operation decimation controller circuit 339 asserts a disable signal 321 that causes noise predictive calibration circuit 311 and equalizer calibration circuit 319 to continue operation at a reduced update rate similar to that discussed below in relation to FIG. 6. For example, where normal operation causes noise predictive filter target 351 and coefficients 359 to update every four samples, the operation may be decimated such that noise predictive filter target 351 and coefficients 359 update only once every 32 samples. Based upon the disclosure provided herein, one of ordinary skill in the art will recognize a variety of decimated update rates that may be used in relation to different embodiments of the present invention. In such embodiments, when all of the respective circuits cease operating at the same time, power monitor and operation decimation controller circuit 339 de-asserts a disable signal 321 which causes noise predictive calibration circuit 311 and equalizer calibration circuit 319 to return to normal operation.

Figure 4:
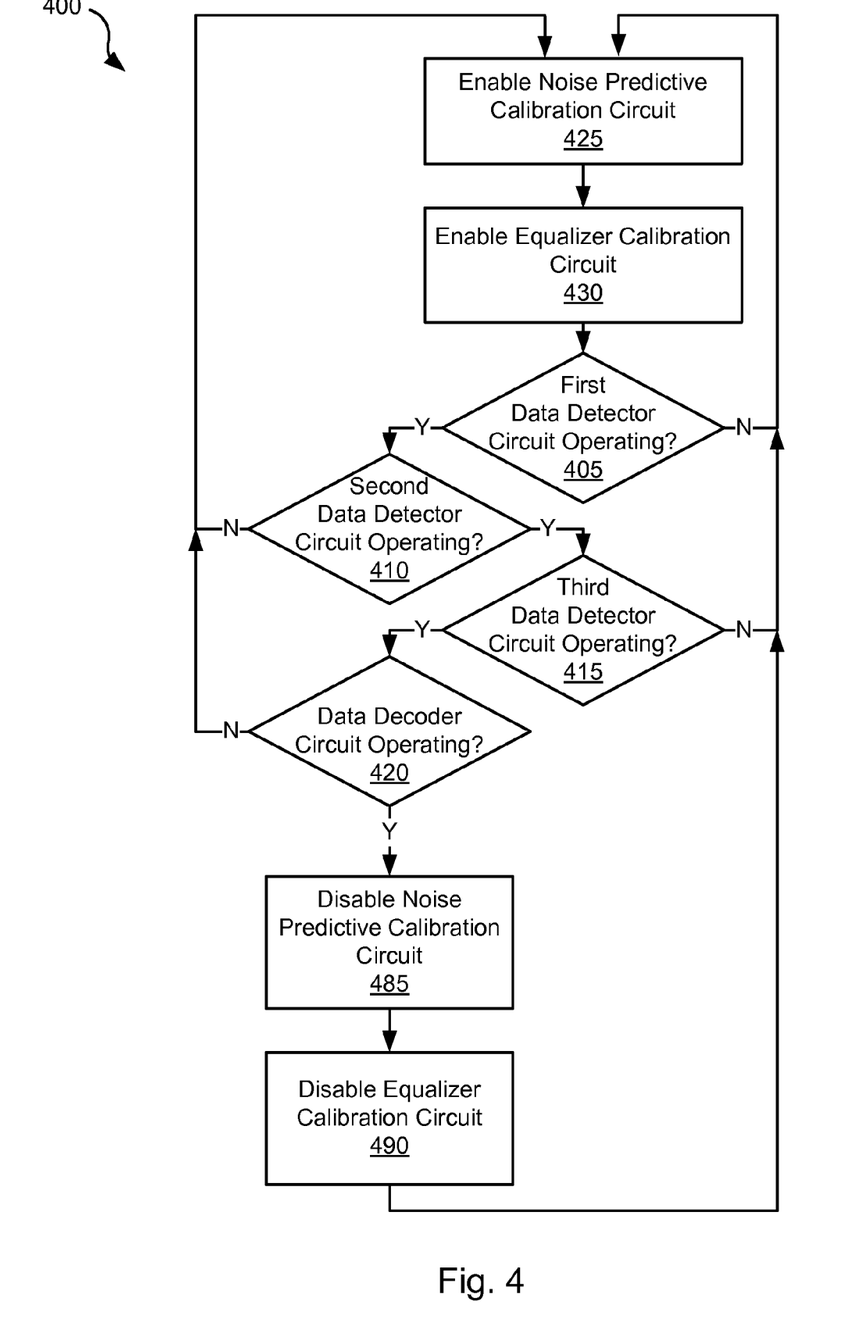
FIG. 4 is a flow diagram showing a method in accordance with some embodiments of the present invention for mitigating over current scenarios in a variable data processing system.

Turning to FIG. 4, a flow diagram 400 shows a method in accordance with some embodiments of the present invention for mitigating over current scenarios in a variable data processing system. Following flow diagram 400, it is determined whether a first data detector circuit is currently operating (block 405). Where the first data detector circuit is currently operating (block 405), it is determined whether the second data detector circuit is currently operating (block 410). Where the second data detector circuit is currently operating (block 410), it is determined whether the third data detector circuit is currently operating (block 415). Where the third data detector circuit is currently operating (block 415), it is determined whether the data decoder circuit is currently operating (block 420). Where the data decoder circuit is currently operating (block 420) (i.e., all of the first data detector circuit, the second data detector circuit, the third data detector circuit, and the data decoder circuit are operating simultaneously), a noise predictive calibration circuit is disabled (block 485) and an equalizer calibration circuit is disabled (block 490) resulting in a reduction of current usage. Otherwise, where any of the first data detector circuit, the second data detector circuit, the third data detector circuit, or the data decoder circuit is not operating (blocks 405-420), noise predictive calibration circuit is enabled (block 425) and an equalizer calibration circuit is enabled (block 430).

Turning to FIG. 5, a flow diagram 500 shows a method in accordance with other embodiments of the present invention for mitigating over current scenarios in a variable data processing system. Following flow diagram 500, it is determined whether a first data detector circuit is currently operating (block 505). Where the first data detector circuit is currently operating (block 505), it is determined whether the second data detector circuit is currently operating (block 510). Where the second data detector circuit is currently operating (block 510), it is determined whether the third data detector circuit is currently operating (block 515). Where the third data detector circuit is currently operating (block 515), it is determined whether the data decoder circuit is currently operating (block 520). Where the data decoder circuit is currently operating (block 520) (i.e., all of the first data detector circuit, the second data detector circuit, the third data detector circuit, and the data decoder circuit are operating simultaneously), a disable flag is set (block 525). The disable flag signals the occurrence of the disabling of a noise predictive calibration circuit and an equalizer calibration circuit resulting in a reduction of current usage. In addition, the noise predictive calibration circuit is disabled (block 585) and the equalizer calibration circuit is disabled (block 590) resulting in a reduction of current usage.

Otherwise, where any of the first data detector circuit, the second data detector circuit, the third data detector circuit, or the data decoder circuit is not operating (blocks 505-520), noise predictive calibration circuit is enabled at an increased rate of change for N clock cycles (block 535). Once the N clock cycles have passed, the rate of change of the noise predictive calibration is returned to a normal rate of change. In some embodiments of the present invention, the rate of change is modified by changing a gain factor applied to an error in the calibration circuit. in addition, equalizer calibration circuit is enabled at an increased rate of change for N clock cycles (block 540). Once the N clock cycles have passed, the rate of change of the equalizer calibration is returned to a normal rate of change. In some embodiments of the present invention, the rate of change is modified by changing a gain factor applied to an error in the calibration circuit.

Turning to FIG. 6, a flow diagram 600 shows a method in accordance with yet other embodiments of the present invention for mitigating over current scenarios in a variable data processing system. Following flow diagram 600, it is determined whether a first data detector circuit is currently operating (block 605). Where the first data detector circuit is currently operating (block 605), it is determined whether the second data detector circuit is currently operating (block 610). Where the second data detector circuit is currently operating (block 610), it is determined whether the third data detector circuit is currently operating (block 615). Where the third data detector circuit is currently operating (block 615), it is determined whether the data decoder circuit is currently operating (block 620). Where the data decoder circuit is currently operating (block 620) (i.e., all of the first data detector circuit, the second data detector circuit, the third data detector circuit, and the data decoder circuit are operating simultaneously), a rate of update of the noise predictive calibration is reduced (block 625). For example, where normal operation causes the noise predictive calibration to update every four samples, the operation may be decimated such that noise predictive calibration is updated only once every 32 samples. Based upon the disclosure provided herein, one of ordinary skill in the art will recognize a variety of decimated update rates that may be used in relation to different embodiments of the present invention. Similarly, a rate of update of the equalizer calibration is reduced (block 630). Otherwise, where any of the first data detector circuit, the second data detector circuit, the third data detector circuit, or the data decoder circuit is not operating (blocks 605-620), the rate of update of the noise predictive calibration is returned to the full rate (block 635), and the rate of update of the equalizer calibration is returned to the full rate (block 640).

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for power monitoring. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a noise predictive calibration circuit operable to provide a noise predictive parameter;
    a first data detector circuit, wherein operation of the first data detector circuit is governed at least in part by the noise predictive parameter;
    a second data detector circuit, wherein operation of the second data detector circuit is governed at least in part by the noise predictive parameter;
    a data decoder circuit;
    a power governing circuit operable to determine that a defined set of the first data detector circuit, the second data detector circuit, and the data decoder circuit are operating simultaneously, and to modify operation of the noise predictive calibration circuit.

2. The data processing system of claim 1, wherein the data processing system further comprises:
    an equalizer calibration circuit, wherein the equalizer calibration circuit is operable to provide an equalizer parameter;
    an equalizer circuit operable to equalize a data input to yield an equalized output governed at least in part by the equalizer parameter;
    wherein the first data detector circuit is operable to apply a data detection algorithm to the equalized output to yield a first detected output; and
    wherein the power governing circuit is further operable to modify operation of the equalizer calibration circuit.

3. The data processing system of claim 2, wherein modifying operation of the equalizer calibration circuit includes performing an operational modification selected from a group consisting of: disabling the equalizer calibration circuit, and reducing an update rate of the equalizer parameter by the equalizer calibration circuit.

4. The data processing system of claim 2, wherein the data detection algorithm is selected from a group consisting of: a maximum a posteriori data detection algorithm, and a Viterbi data detection algorithm.

5. The data processing system of claim 2, wherein the data decoder circuit is operable to apply a data decode algorithm to the first detected output to yield a decoded output; wherein the second data detector circuit is operable to apply the data detection algorithm to the equalized output guided by the decoded output to yield a second detected output.

6. The data processing system of claim 5, wherein the data decoder circuit is a low density parity check decoder circuit.

7. The data processing system of claim 1, wherein the system is implemented as an integrated circuit.

8. The data processing system of claim 1, wherein the data processing system is incorporated in a device selected from a group consisting of: a storage device, and a data transmission device.

9. The data processing system of claim 1, wherein modifying operation of the noise predictive calibration circuit includes performing an operational modification selected from a group consisting of: disabling the noise predictive calibration circuit, and reducing an update rate of the noise predictive parameter by the noise predictive calibration circuit.

10. A data processing system, the data processing system comprising:
    an equalizer calibration circuit, wherein the equalizer calibration circuit is operable to provide an equalizer parameter;
    an equalizer circuit operable to equalize a data input to yield an equalized output governed at least in part by the equalizer parameter;
    a data detector circuit operable to apply a data detection algorithm to the equalized output to yield a detected output;
    a data decoder circuit operable to apply a data decode algorithm to the detected output to yield a decoded output;
    a power governing circuit operable to determine that a defined set of the data detector circuit and the data decoder circuit are operating simultaneously, and to modify operation of the equalizer calibration circuit.

11. The data processing system of claim 10, wherein modifying operation of the equalizer calibration circuit includes performing an operational modification selected from a group consisting of: disabling the equalizer calibration circuit, and reducing an update rate of the equalizer parameter by the equalizer calibration circuit.

12. The data processing system of claim 10, wherein the data detector circuit is a first data detector circuit and the detected output is a first detected output, and wherein the data processing system further comprises:

a second data detector circuit operable to apply the data detection algorithm to the equalized output guided by the decoded output to yield a second detected output.

13. The data processing system of claim 12, wherein the data processing system further comprises:
a noise predictive calibration circuit operable to provide a noise predictive parameter;
wherein operation of the first data detector circuit is governed at least in part by the noise predictive parameter; and
wherein operation of the second data detector circuit is governed at least in part by the noise predictive parameter.

14. The data processing system of claim 13, wherein the power governing circuit is further operable to determine that a defined set of the first data detector circuit, the second data detector circuit, and the data decoder circuit are operating simultaneously, and to modify operation of the noise predictive calibration circuit.

15. The data processing system of claim 14, wherein modifying operation of the noise predictive calibration circuit includes performing an operational modification selected from a group consisting of: disabling the noise predictive calibration circuit, and reducing an update rate of the noise predictive parameter by the noise predictive calibration circuit.

16. The data processing system of claim 10, wherein the data detection algorithm is selected from a group consisting of: a maximum a posteriori data detection algorithm, and a Viterbi data detection algorithm.

17. The data processing system of claim 10, wherein the data decoder circuit is a low density parity check decoder circuit.

18. The data processing system of claim 10, wherein the system is implemented as an integrated circuit.

19. The data processing system of claim 10, wherein the data processing system is incorporated in a device selected from a group consisting of: a storage device, and a data transmission device.

20. A method for data processing, the method comprising:
updating an equalizer parameter;
equalizing a data input to yield an equalized output based at least in part on the equalizer parameter;
updating a noise predictive parameter;
applying a data detection algorithm by a first data detector circuit to the equalized output to yield a first detected output based at least in part on the noise predictive parameter;
applying a data decode algorithm by a data decode circuit to the first detected output to yield a decoded output;
applying the data detection algorithm by a second data detector circuit to the equalized output guided by the decoded output to yield a second detected output based at least in part on the noise predictive parameter;
determining that a defined set of the first data detector circuit, the second data detector circuit, and the data decoder circuit are operating simultaneously;
modifying updating of the equalizer parameter based at least in part on the determination that the defined set of the first data detector circuit, the second data detector circuit, and the data decoder circuit are operating simultaneously; and
modifying updating of the noise predictive parameter based at least in part on the determination that the defined set of the first data detector circuit, the second data detector circuit, and the data decoder circuit are operating simultaneously.

* * * * *